(12) United States Patent
Blaud et al.

(10) Patent No.: US 6,215,367 B1
(45) Date of Patent: *Apr. 10, 2001

(54) CIRCUIT FOR AVOIDING PARASITIC OSCILLATION MODES IN AN OSCILLATOR RESONANT CIRCUIT

(75) Inventors: Phillippe Blaud, Villingen-Schwenningen; Martin Rieger, Rottweil; Heinrich Schemmann, Villingen-Schwenningen, all of (DE)

(73) Assignee: Deutsche Thomson-Brandt GmbH, Villingen-Schwenningen (DE)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/031,582

(22) Filed: Feb. 27, 1998

(30) Foreign Application Priority Data

Mar. 7, 1997 (DE) .............................................. 197 09 289
Oct. 28, 1997 (DE) .............................................. 197 47 432

(51) Int. Cl.$^7$ ............................................................. H03B 5/12
(52) U.S. Cl. ................ 331/105; 331/108 D; 331/117 D; 331/177 V; 331/117 R
(58) Field of Search ....................... 331/108 C, 117 R, 331/105, 108 D, 117 D, 177 V, 36 C, 167

(56) References Cited

U.S. PATENT DOCUMENTS

| | | | |
|---|---|---|---|
| 4,485,355 | 11/1984 | Scott | 331/117 FE |
| 4,677,396 | * 6/1987 | Cruz et al. | 331/117 R |
| 4,897,624 | 1/1990 | Wingot et al. | 334/80 |
| 5,029,267 | 7/1991 | Masuda et al. | 331/107 A |
| 5,140,286 | * 8/1992 | Black et al. | 331/99 |
| 5,345,194 | 9/1994 | Nagasako | 331/99 |
| 5,402,087 | * 3/1995 | Gorczak | 331/117 D |
| 5,418,500 | * 5/1995 | Igarashi | 331/76 |
| 5,434,542 | 7/1995 | Veith et al. | 331/99 |
| 5,444,422 | 8/1995 | Mycynek | . |
| 5,539,358 | 7/1996 | Hedberg | 331/107 A |
| 5,850,595 | 12/1998 | Rieger et al. | 455/317 |

FOREIGN PATENT DOCUMENTS

| | | | |
|---|---|---|---|
| 0417668 | 3/1991 | (EP) | H03H/7/38 |
| 0660504 | 12/1994 | (EP) | H03B/5/12 |
| 0656683B1 | 6/1995 | (EP) | H03B/1/04 |
| 0735678 | 2/1996 | (EP) | H03K/3/0231 |
| 0735678 | 10/1996 | (EP) | H03K/3/0231 |
| 2228154 | 8/1990 | (GB) | H03B/1/04 |

OTHER PUBLICATIONS

Steyaert, M., Craninchx, J. GHz Oscillator Using Bandwire Inductance in: Electronics Letters, Feb. 3, 1994, vol. 30, No. 3 S244,245.

Translated German Patent Office search report dated Sep. 10, 1997.

European Search Report dated Dec. 11, 1998.

* cited by examiner

Primary Examiner—Arnold Kinkead
(74) Attorney, Agent, or Firm—Joseph S. Tripoli; Kuniyuki Akiyama

(57) ABSTRACT

The reduction of interfering influences in an LC resonant circuit with an integrated circuit is effected by including the interfering elements of the housing in the resonant circuit. This precludes the occurrence of parasitic radio-frequency oscillation modes. It also ensures good radio-frequency properties and a wide frequency tuning range.

6 Claims, 3 Drawing Sheets

CIRCUIT FOR AVOIDING PARASITIC OSCILLATION MODES IN AN OSCILLATOR RESONANT CIRCUIT

The invention is based on a circuit for avoiding parasitic oscillation modes in an oscillator resonant circuit.

Oscillator circuits can be subdivided into 2 classes, multivibrators and harmonic oscillators.

Multivibrators oscillate by virtue of a capacitance being charged and discharged between 2 internal switching thresholds. The circuit switches back and forth from one state to the other each time one of the 2 switching thresholds is reached. The charging and discharging operation of the capacitance determines the time constant for the switching back and forth. Multivibrators are highly suitable as integrated oscillators since they require no external components, in particular no inductance and no variable-capacitance diode. In addition, they can be set well and reliably in a wide frequency range. They do have limitations, however. Their radio-frequency capability is limited by the switching times and their spectral purity is poor because the switching thresholds and the charging currents are subject to random variations which cause phase jitter. RC relaxation oscillators and emitter-coupled oscillators belong to the multivibrator class. Ring oscillators can also be integrated well and can even operate in the GHz range, but have a similarly poor phase noise to that of multivibrators.

Harmonic oscillators normally require an LC resonant circuit or a quartz crystal as frequency-determining component and are correspondingly poorly integrable. Their phase noise, on the other hand, is good and given by the frequency-selective nature (high quality factor) of the LC resonant circuit. For broadband applications, however, it is necessary, under certain circumstances, to make the compromise of accepting a poorer quality factor and corresponding degradation of the phase noise in order to enlarge the frequency setting range.

The phase noise is an important parameter of a receiver. Stringent phase noise requirements are imposed particularly for the reception of modern digital modulation methods, such as, for example, QPSK or QAM for satellite and cable television transmission or GMSK and GFSK for GSM and DECT mobile telephones.

Many of these services have settled in the low GHz range. 0.95 . . . 2.15 GHz for digital satellite reception, 0.9 and/or 1.8 GHz for GSM and DECT. The current trend shows that further promising applications will use frequency bands in this low 1 . . . 6 GHz range. In this respect, it is an important task to design receivers and, in particular, oscillators which have good radio-frequency properties.

A typical harmonic oscillator thus comprises an integrated amplifier and an external LC resonant circuit; in between is a part of the housing, which, under certain circumstances, forms a parasitic resonant circuit, as a result of which a parasitic oscillation mode can then also be caused. The gain factor and the phase shift in the oscillator loop govern whether the desired oscillation mode or the parasitic oscillation mode is established. If it is desired to achieve high oscillation frequencies—for example above 1 GHz—, the problem is aggravated since bonding wire inductance and pin capacitance may be of the order of magnitude of the useful elements of the external resonant circuit and then have a greater effect, that is to say are even more interfering than otherwise. If it were additionally desired to cover a wide frequency range, it is no longer possible to rely on the high frequency selectivity or the high quality factor of the external LC resonant circuit and the suppression of radio-frequency parasitic oscillation modes becomes even more difficult.

In such an oscillatory having an external LC resonant circuit, the radio-frequency parasitic oscillation mode caused by the housing may possibly be attenuated by integrated resistors, so that only the desired oscillation mode occurs. However, this measure impairs the circuit quality factor and the phase noise of the oscillators. In addition, it is an empirical and possibly lengthy method until the attenuating resistors are optimized, because it is difficult to model a housing with the required accuracy and this is ultimately achieved only by trial and error.

The invention is based on the object of reducing the interfering influences in a harmonic oscillator having an LC resonant circuit. This object is achieved by means of the features of the invention which are specified in the claims. Advantageous developments of the invention are specified in the subclaims.

In the circuit according to the invention, the reduction of interfering influences in an LC resonant circuit with an integrated circuit is effected by including the interfering elements of the housing in the resonant circuit. The interfering elements are included by forming a series resonant circuit via 2 pins, where the inductance of the housing (bonding wire and lead frame) and of the external connections on the printed circuit board are added to the useful inductance of the LC resonant circuit. These values can thus be incorporated into the resonant circuit calculation, with the result that the factors that otherwise have an interfering effect are already taken into account from the outset. The series LC resonant circuit thus comprises, in principle, an integrated capacitance and an inductance which is composed of the housing inductance via 2 pins and of the external—parasitic and/or useful—inductance on the printed circuit board.

A—possibly more than one—variable-capacitance diode is used for the frequency tuning. A variable-capacitance diode with good tuning capabilities can be integrated only with difficulty. It should preferably be arranged externally for broad band applications.

This variable-capacitance diode is included in the series resonant circuit and may be regarded as a shortening capacitor which reduces the total series capacitance. This enables high frequencies to be set. With a low capacitance, that is to say a small value "C", the oscillation frequency $f=\frac{1}{2\pi\sqrt{LC}}$ becomes high, and a good phase noise is maintained even after these high frequencies.

In principle, the phase noise deteriorates with frequency. However, it is also proportional to the circuit quality factor $Q=(1/R_{series})*\sqrt{L/C}$, which in this case improves with a low capacitance, that is to say a small value "C", that is to say at higher frequencies.

The oscillator according to the invention is preferably intended to be constructed as a balanced Colpitts oscillator. If an external variable-capacitance diode is required, at least one connecting pin is necessary. In order to offer a return path to the radio-frequency currents occurring in the external part of the LC resonant circuit, it is advantageous to make the LC resonant circuit balanced, in other words to use 2 connecting pins. This balanced arrangement additionally makes the oscillator more robust with regard to interference, and reduces the risk of the oscillator itself interfering with other circuit blocks.

Typical, preferably balanced, oscillators require 4 connecting pins for the external LC resonant circuit. The inventive circuit manages with 2 connecting pins and the resonant circuit is now partially integrated. This reduces the number of external components and reduces the space requirement on the printed circuit board. This higher integration level is particularly advantageous for portable applications. However, it is also possible either to completely omit the 2 pins that have become free and select a smaller, less expensive housing, or to use the said pins only for improving the IC function, for example for better heat dissipation or for a double bond on a critical radio-frequency pin.

Compared with multivibrators, harmonic oscillators intrinsically have a good phase noise. It is critically determined by the quality factor of the LC resonant circuit.

In the case of the oscillator arrangement that has been invented, a high quality factor can be achieved if the parasitic serial resistance of the LC resonant circuit is minimized. The variable-capacitance diode itself is intended to have a minimal parasitic resistance. The integrated capacitance is to be carefully configured in the layout. It is advantageous to place it as near as possible to the two connecting pins and make contact with it using wide low-impedance metal tracks. Its parasitic serial resistance can be minimized if the integrated capacitance is made long, that is to say has a large length-to-width ratio, which corresponds to the low-impedance parallel connection of a large number of square resistors.

In the case of the harmonic LC oscillator arrangement that has been invented, it is not necessary to take specific measures which suppress the parasitic radio-frequency oscillation modes but simultaneously impair the phase noise, such as attenuating resistors, for example.

The oscillator circuit that has been invented is thus particularly suitable for radio-frequency applications in the 0.5 . . . 4 GHz range and offers a wide frequency tuning range, up to approximately one octave, because the resonant circuit arrangement precludes the occurrence of radio-frequency parasitic oscillation modes. Moreover, this harmonic oscillator has a good phase noise.

In a development of the invention, the oscillator is intended to be designed in such a way that it is possible to cover a large frequency range.

The circuit according to the invention has been improved further. Colpitts oscillators are known, but not in the way in which they have been realized in the developed circuit, that is to say the division of the resonant circuit with the internal capacitances and the external part in which the inductance component can be set by a variable-capacitance diode.

At the heart of the development is the differential amplifier once again, which is formed from two transistors and the resonant circuit. Collector-base cross-coupling has been used in each case as an aide. However, the cross-coupling is now formed by the collector of one transistor being coupled via an emitter follower and the capacitance $C_{CB}$ to the base of the second transistor and the collector of the second transistor being coupled via an emitter follower and the capacitance $C_{CB}$ to the base of the first transistor. The coupling is preferably implemented by capacitors.

The basis of the differential amplifier are in antiphase and, for each transistor, the collector and base are in antiphase. As a result, an identification takes place, that is to say the collector and base are cross-coupled in such a way that they are in phase. The signal lines are added, however, and contribute to the increase in the radio-frequency gain factor of the amplifier stage. The abovementioned identification may also be regarded as a phase relation. This phase relation applies only for as long as no phase shift occurs due to the capacitance. In order to consider this in greater detail the capacitance of the cross-coupling is seen in connection with the collector load resistors. These form a high-pass filter for the feedback signal. Amplitude and phase are characteristic for the high-pass filter. In the case of amplitude, the signal is initially allowed to pass and attenuation occurs starting from a cut-off point. In phase terms, a phase shift is produced starting at the cut-off point. In the development of the cross-coupling, the phase shift is intended to be effected only at the highest possible frequency, since otherwise the collector and base are no longer in phase at the oscillation frequency. In order to achieve this, the passband of the high-pass filter must be increased according to the invention. This is achieved according to the invention by the fact that an emitter follower is now used, as already mentioned above, instead of the collector resistor. This raises the cut-off frequency, with the result that the fundamental frequency of the oscillator acquires a greater distance from the cut-off frequency.

The following abbreviations are used in the formula below:

cut-off frequency=Fg
collector resistor=$R_c$
Capacitance of the cross-coupling=$C_{CB}$ The cut-off frequency of the high-pass filter can be calculated by $$Fg=1/(2\pi \times R_c \times C_{CB})$$

The collector resistor has now been replaced by the output resistance of the emitter follower in this high-pass filter. Consequently, it is possible to reduce the resistance of the high-pass filter and increase the cut-off frequency. The output resistance of the emitter follower can be set by the current of the emitter follower.

The invention is explained below with reference to the drawings, in which.

Figure 1:
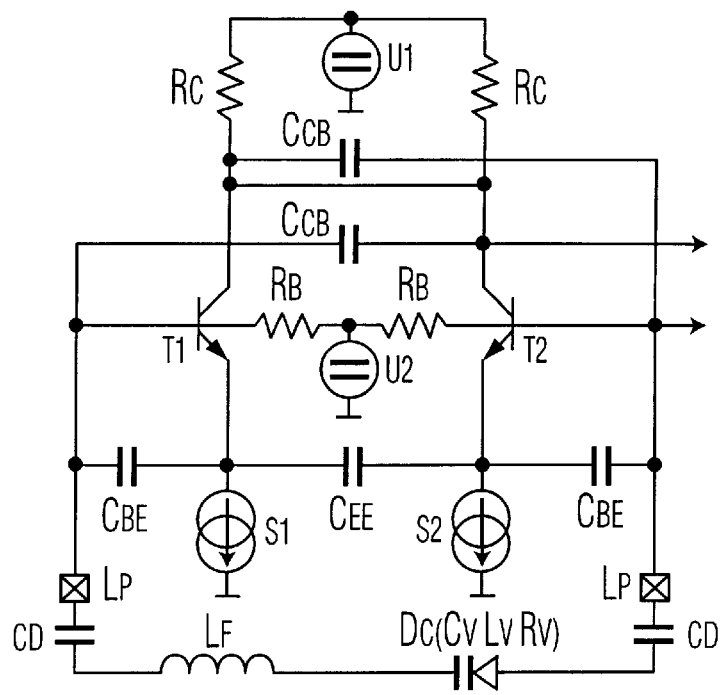
FIG. 1 shows a circuit according to the invention.

FIG. 1 shows a differential amplifier and a series resonant circuit constructed in a balanced manner. The transistors T1, T2 form a common-base differential amplifier. They are connected to the base resistors RB, which are connected to a voltage source U2. They are connected to the collector resistors RC, which serve as load and are connected to a voltage supply U1. The emitters are connected to the current sources S1, S2. The output OUT supplies a mixer and/or PLL circuit, for example. The capacitor $C_{BE}$ is connected between base and emitter and a capacitor CEE is connected between the balanced emitters of the transistors T1, T2. The respective bases and collectors of the transistors T1, T2 are connected by capacitors $C_{CB}$, which form positive feedback and support the radio-frequency oscillations. The capacitor CD serves for coupling the external inductance LF and variable-capacitance diode $DC_C$ in terms of AC voltage to the integrated part of the resonant circuit, the series capacitances CBE, CEE, CBE. The value of the variable-capacitance diode is set by a DC voltage. LP represents the inductance of the connecting wires. The external part of the series resonant circuit CD, DC, LF is connected via these connecting wires LP to the integrated circuit CBE, CEE, CBE and differential amplifier.

In the circuit according to the invention, the resonant circuit is partially integrated in the form of fixed capacitances CBE, CEE, CBE and partially external in the form of a variable inductance for setting the oscillation frequency. This variable external inductance consists of a fixed inductance LF in series with a variable-capacitance diode DC, which enables the frequency setting. Internal fixed capacitances and external variable inductances are connected in a balanced manner via the housing and 2 pins. These are modelled as bonding wire inductance LP. Since they are now component parts of the useful resonant circuit, they cannot form a parasitic resonant circuit, which precludes the production of a parasitic radio-frequency oscillation mode. It can be seen from the circuit that has just been described that these interfering elements have been included in the resonant circuit.

Figure 2:
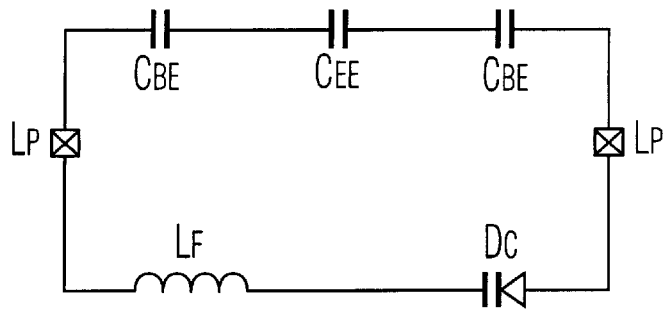
FIGS. 2, 3 show an equivalent circuit diagram of the circuit according to the invention.
Figure 3:
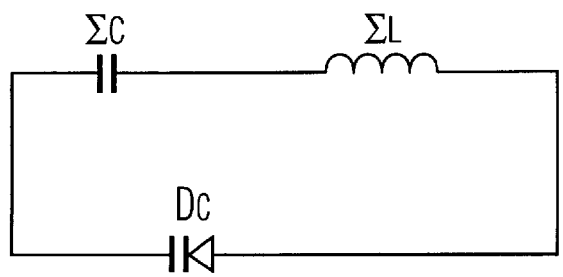

FIGS. 2 and 3 show an equivalent circuit diagram of the individual components. FIG. 2 reveals that all the capacitances and inductances form a series resonant circuit. Identical component designation points to the reference back to FIG. 1. FIG. 3 shows that the sum of the individual components has been formed in order to show a series resonant circuit once again in terms of an equivalent circuit diagram. Since it is an equivalent circuit diagram, no voltage is entered, but it is evidence that given the application of a voltage, a resonant circuit would be present which oscillates at a frequency that would result from the number of inductances and capacitances.

Figure 4:
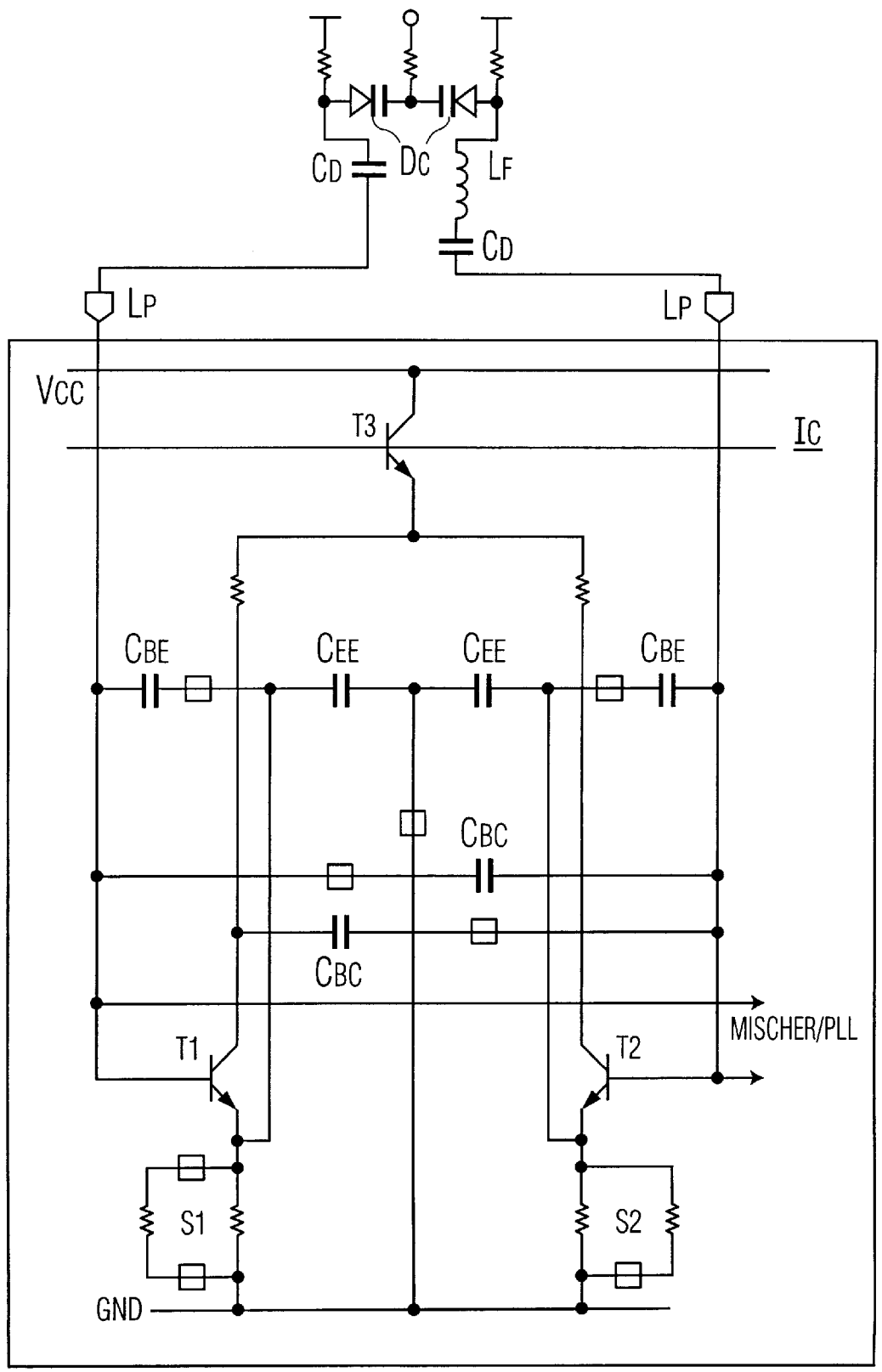
FIG. 4 shows a refinement of the circuit according to the invention.

FIG. 4 shows a further design of the resonant circuit. Identical component designation points to the reference back to FIG. 1. The current sources S1 and S2 are formed by a resistor ring. In this figure, it can clearly be seen that the resonant circuit is partially situated in the integrated circuit and the external two variable-capacitance diodes DC and the inductance LF are connected up via the connecting pins which form an inductance LP. The supply voltage VCC passes via a transistor T3 to the collector resistors. The resonant circuit is caused to oscillate by the inherent noise of the components. Tuning can be performed externally by the variable-capacitance diodes DC. Since the interfering elements, that is to say the inductance of the 2 connecting pins LP and of their bonding wires, have been integrated into the resonant circuit, the otherwise interfering influences are suppressed.

The oscillator is preferably an oscillator having capacitive feedback. This oscillator is constructed in a balanced manner via two pins and can be tuned via the variable-capacitance diode, that is to say via a capacitance.

Figure 5:
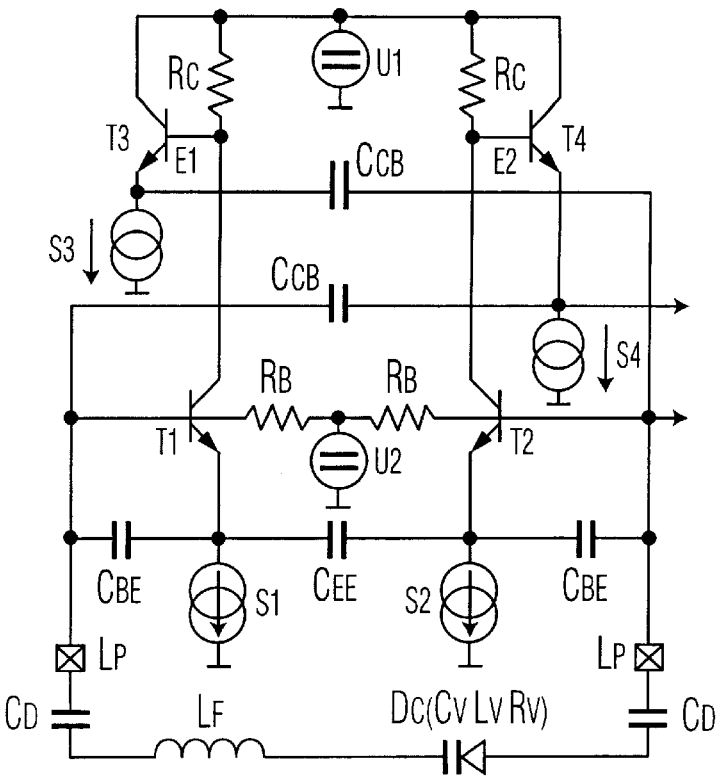
FIGS. 5, 6 show a development of the circuit according to the invention and the amplitude and phase profiles.

FIG. 5 shows the components known from FIG. 1. Identical component designation points to identical function indications and will not, therefore, be explained in further detail. The emitter followers E1, E2 with the transistor T3 and T4 and the current sources S3 and S4 have, however, been additionally inserted in FIG. 5.

The differential amplifier is once again formed from the transistors T1, T2. Furthermore, collector-base cross-coupling is used. The cross-coupling is formed by the collector of one transistor T1 being coupled via the emitter follower E1 and the capacitance $C_{CB}$ to the base of the second transistor T2 and the collector of the second transistor T2 being coupled via the emitter follower E2 and the capacitance $C_{CB}$ to the base of the first transistor T1.

As a result, no phase shift is produced during the cross-coupling, so that the collector and base are in phase. Furthermore, the cut-off frequency fg', which is responsible for the abovementioned cut-off point fg, is raised, with the result that the fundamental frequency fn of the oscillator acquires a greater distance from the cut-off frequency fg'.

The collector resistor RC shown in FIG. 1 has now been replaced by the output resistance of the emitter follower in the high-pass filter. It is thus possible to reduce the resistance of the high-pass filter and increase the cut-off frequency. The output resistance of the emitter follower can be set by the current of the emitter follower.

Figure 6A:
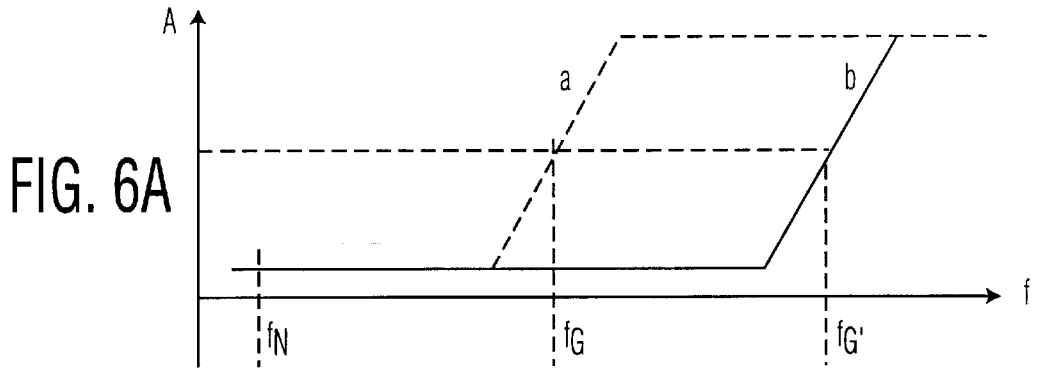
Figure 6B:
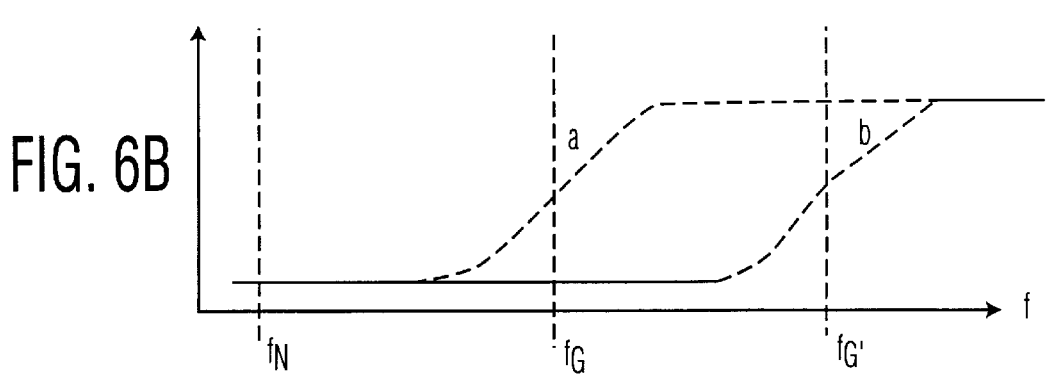

The method of operation of the emitter followers T3 and T4 will be explained with reference to FIG. 6. FIG. 6 illustrates the amplitude profile A as a function of the frequency f and, furthermore, the phase profile φ as a function of the frequency f, which is characteristic of the high-pass filter. In the case of amplitude, the signal is firstly allowed to pass and attenuation occurs starting at a cut-off point. In terms of phase, a phase shift is produced starting at the cut-off point. The curve profile a of the amplitude and phase shows the profile in the case of using a collector resistor in the cross-coupling of the differential amplifier T1, T2. The cut-off frequency is indicated by fg and the fundamental frequency by fn.

The curve profile b shows how the profile of the high-pass filter is changed in such a way that the cut-off frequency fg' is displaced to a higher frequency range. The cut-off frequency for the phase shift fg' is also displaced to a higher profile. On account of the changed high-pass filter profile as a result of the emitter followers in the cross-coupling, it is now possible to increase the region between fundamental frequency fn and cut-off frequency fg'.

What is claimed is:

1. An oscillator circuit for producing a high frequency oscillation, said oscillator circuit being constructed as a balanced Colpitts oscillator, and comprising:

an LC resonant circuit with dedicated elements contributing to the frequency of the resonant oscillation and with parasitic elements;

an integrated amplifier internal to an integrated circuit, said amplifier being coupled to said LC resonant circuit;

said dedicated elements being partially internal to said integrated circuit and being partially external to said integrated circuit;

said internal elements comprising a capacitance, said external elements comprising a variable impedance;

said LC resonant circuit being a series resonant circuit comprising said dedicated internal and external elements, and which are interconnected via two connecting pins and bond wires of said integrated circuit for forming a closed loop, and said connecting pins and said bond wires being parasitic inductances which contribute to the total inductance value of said LC series resonant circuit.

2. The oscillator circuit according to claim 1, wherein said variable impedance comprises a fixed inductance in series with a variable-capacitance diode.

3. The oscillator circuit according to claim 2, wherein said external variable-capacitance diode serves for frequency tuning in said series resonant circuit and operates as a shortening capacitor with which the total series capacitance can be set.

4. The oscillator circuit according to claim 1, wherein said amplifier includes a differential amplifier with two transistors which are connected via a cross-coupling with two integrated capacitances between their collector and base terminals.

5. The oscillator circuit according to Claim 4, wherein said cross-coupling is formed by two capacitances and two emitter followers in series.

6. An oscillator circuit for producing a high frequency oscillation, said oscillator circuit being constructed as a balanced Colpitts oscillator comprising:

an LC resonant circuit with dedicated elements contributing to the frequency of the resonant oscillation and with parasitic elements;

an integrated amplifier internal to an integrated circuit, said amplifier including a differential amplifier with two transistors being coupled to said LC resonant circuit;

said dedicated elements being partially internal to said integrated circuit and being partially external to said integrated circuit;

said dedicated internal elements comprising a capacitance, said dedicated external elements comprising a variable impedance;

said LC resonant circuit being a series resonant circuit comprising said dedicated internal and external elements, and being interconnected via two connecting pins and bond wires of said integrated circuit;

said connecting pins and said bond wires being parasitic inductances which contribute to the total inductance value of said LC series resonant circuit wherein said internal elements include a capacitance connected between the emitters of said two transistors and a capacitance between the base and the emitter of each of the transistors.

* * * * *